(12) United States Patent  
Chen et al.

(10) Patent No.: US 7,317,632 B2  
(45) Date of Patent: Jan. 8, 2008

(54) NON-VOLATILE MEMORY STORAGE DEVICE AND CONTROLLER THEREFOR

(75) Inventors: Li-Pai Chen, Chung Ho (TW); Ming-Dar Chen, Chung-Ho (TW); Hsiang-An Hsieh, Hsintien (TW); Yen-Hsin Liu, Chung Ho (TW)

(73) Assignee: A-Data Technology Co., Ltd., Taipei (TW)

( * ) Notice: Subject to any disclaimer, the term of this patent is extended or adjusted under 35 U.S.C. 154(b) by 37 days.

(21) Appl. No.: 11/341,682

(22) Filed: Jan. 30, 2006

(65) Prior Publication Data

US 2007/0133299 A1   Jun. 14, 2007

(30) Foreign Application Priority Data

Dec. 9, 2005   (TW) ............................... 94143693 A

(51) Int. Cl.
*G11C 11/34* (2006.01)
*G11C 5/34* (2006.01)

(52) U.S. Cl. ........................... 365/185.08; 365/185.18; 365/226

(58) Field of Classification Search .................. 365/52, 365/226, 185.08, 185.09, 185.18, 185.29, 365/185.33

See application file for complete search history.

(56) References Cited

U.S. PATENT DOCUMENTS

| | | | | |
|---|---|---|---|---|
| 5,928,336 | A  * | 7/1999  | Takeuchi ...................... | 365/52 |
| 6,687,164 | B2 * | 2/2004  | Matsuda et al. ........ | 365/185.29 |
| 7,012,845 | B2 * | 3/2006  | Kozakai et al. ......... | 365/185.09 |
| 7,092,294 | B2 * | 8/2006  | Sato et al. .............. | 365/185.18 |
| 7,116,578 | B2 * | 10/2006 | Kanamori et al. ...... | 365/185.08 |

* cited by examiner

*Primary Examiner*—Trong Phan  
(74) *Attorney, Agent, or Firm*—Rosenberg, Klein & Lee

(57) ABSTRACT

A non-volatile memory storage device with functions of boosting supply voltage and signal level can adopt a non-volatile memory having an operating voltage higher than the supply voltage provided by the host device as a storage medium. The non-volatile memory storage device includes a supply voltage booster, a non-volatile memory storage unit and a controller. The supply voltage booster boosts the lower supply voltage provided by the host device up to the higher operating voltage of the non-volatile memory. The controller adjusts the interface signal to a proper interface signal level by cooperating with the supply voltage and the operating voltage so as to avoid the interface from damage owing to an over high signal level or avoid the non-volatile memory unit from not correctly receiving signal due to an over low signal level.

14 Claims, 5 Drawing Sheets

NON-VOLATILE MEMORY STORAGE DEVICE AND CONTROLLER THEREFOR

BACKGROUND OF THE INVENTION

1. Field of the Invention

The present invention is related to a non-volatile memory storage device, and more particularly to a non-volatile memory storage device with boosted supply voltage and signal level.

2. Description of Related Art

Non-volatile memory storage apparatus has become smaller and smaller, such as memory card and the application thereof has become wider and wider, for example, it has gradually adopted by the portable device. For matching to the requirement of the portable device, such as mobile phone, the volume of the memory storage device becomes thinner, shorter and smaller and the power consumption is also reduced for satisfying the requirements of reducing product volume and elongating the operating time of battery. Therefore, in some new products, the power supply voltage and interface signal level of the memory device are reduced.

For conforming to the low supply voltage, in the prior art, a controller having an operating voltage conforming to the supply voltage of the host device has to be used and also a non-volatile memory with low operating voltage has to be adopted as the storage medium. That is to say, both the operating voltage of the non-volatile memory storage medium and the memory interface signal level of the controller are equal to or slightly lower than the supply voltage, which is provided by the host device to the storage device. However, due to the voltage limitation, this kind of non-volatile memory storage device with low supply voltage has to adopt non-volatile memory with low supply voltage which is not popular and has lower capacity so that it may cause the maximum capacity of the non-volatile memory storage device with low supply voltage to become lower and also cause an increased cost.

Please refer to FIG. 1 which is a functional block diagram showing the conventional low voltage non-volatile memory storage device. Because the power adjusting circuit 11 can not boost the voltage level and only has functions of voltage stabilization and surge suppression for providing a stable internal operating voltage $V_{IO}$ to the non-volatile memory 13 and the controller 15, the internal operating voltage $V_{IO}$ is approximately equal to or lower than the external supply voltage $V_S$ and the internal interface signal level $V_{INT}$ is also approximately equal to the external interface signal level $V_{EXT}$. Therefore, this kind of non-volatile memory storage device 1 with lower supply voltage, as described above, has a smaller capacity and a higher cost.

For overcoming this problem, the present invention provides the non-volatile memory storage device with low supply voltage with functions of supply voltage boosting and signal level transformation such that the non-volatile memory adopting a normal operating voltage can be used as the storage medium for reducing the cost of the storage device and also increasing the storage capacity.

SUMMARY OF THE INVENTION

For achieving the purpose of adopting a non-volatile memory whose operating voltage is higher than the supply voltage as the storage medium, the present invention provides a voltage booster in the storage device so that the supply voltage can be boosted up to the operating voltage level of the non-volatile memory. Then, because the interface signal level of the non-volatile memory is boosted due to the operating voltage thereof, the memory interface signal level of the controller has to be cooperatively boosted for avoiding the memory interface of the controller from interfacing to a high potential signal source but maintaining at a lower signal level and from resulting in the non-volatile memory not correctly identifying the signal. At this time, the host interface signal level of the controller connected to the host device may still use the supply voltage of the host device to be the reference level so as to avoid the controller from not correctly identifying the high potential signal outputted by the host device or avoid the high potential signal outputted by the controller from exceeding the limited range of the host device (generally, the upper limitation is the supply voltage) due to the interface signal level be higher than the host interface supply voltage.

Therefore, the present invention provides a non-volatile memory storage device including a supply voltage booster for receiving an external voltage, boosting thereof and then outputting an internal voltage; a non-volatile memory storage unit for receiving the internal voltage and providing a storage of digital information; and a controller, wherein the controller includes a host device interface unit electrically connected to a host device, receiving the external voltage and transmitting an external signal between the host device and thereof, wherein the voltage level of the external signal is conformed to the external voltage; and a non-volatile memory interface unit electrically connected to the non-volatile memory storage unit, receiving the internal voltage and transmitting an internal signal between the non-volatile memory storage unit and thereof, wherein the voltage level of the internal signal is conformed to the internal voltage.

The present invention further provides a controller for a non-volatile memory storage device with dual interface signal level, characterized in that the controller includes a non-volatile memory interface unit connected to a non-volatile memory storage unit for boosting a signal level between the controller and the non-volatile memory storage unit up to an operating voltage of the non-volatile memory storage unit; and a host device interface unit connected to a host device for conforming a signal level between the controller and the host device to a supply voltage of the non-volatile memory storage device.

The present invention further provides a non-volatile memory storage device including a non-volatile memory storage unit and a controller, wherein the controller includes a supply voltage booster for receiving an external voltage, boosting thereof and then outputting an internal voltage and for providing the internal voltage to the non-volatile memory storage unit; a host device interface unit electrically connected to a host device, receiving the external voltage and transmitting an external signal between the host device and thereof, wherein the voltage level of the external signal is conformed to the external voltage; and a non-volatile memory interface unit electrically connected to the non-volatile memory storage unit, receiving the internal voltage and transmitting an internal signal between the non-volatile memory storage unit and thereof, wherein the voltage level of the internal signal is conformed to the internal voltage.

The present invention further provides a controller for a non-volatile memory storage device with boosted supply voltage and signal level, characterized in that the controller includes a non-volatile memory interface unit connected to a non-volatile memory storage unit for boosting a signal level between the controller and the non-volatile memory storage unit up to an operating voltage of the non-volatile memory storage unit; a supply voltage booster for boosting a supply voltage of the non-volatile memory storage device up to the operating voltage of the non-volatile memory storage unit so as to supply thereof to the non-volatile memory interface unit and the non-volatile memory storage unit; and a host device interface unit connected to a host device for conforming a signal level between the controller and the host device to the supply voltage of the non-volatile memory storage device.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF PREFERRED EMBODIMENTS

Figure 1:
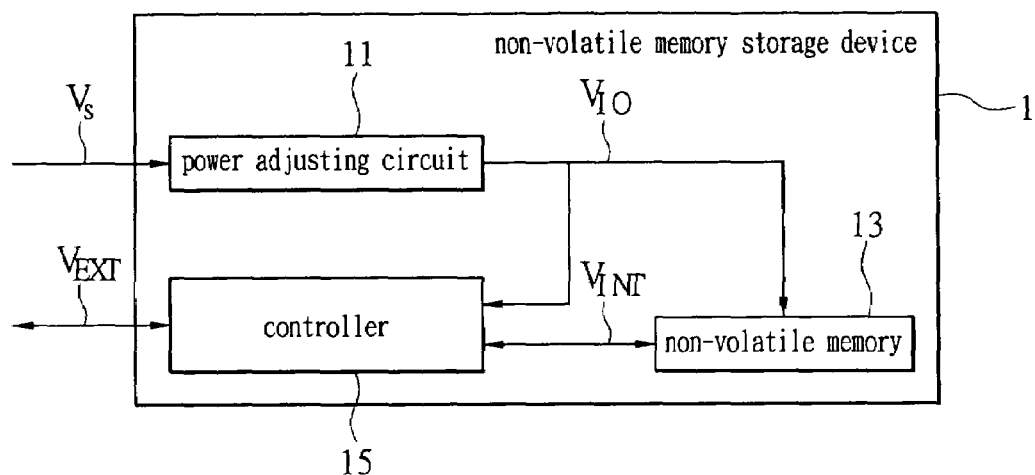
FIG. 1 is a functional block diagram showing a conventional low voltage non-volatile memory storage device.
Figure 2:
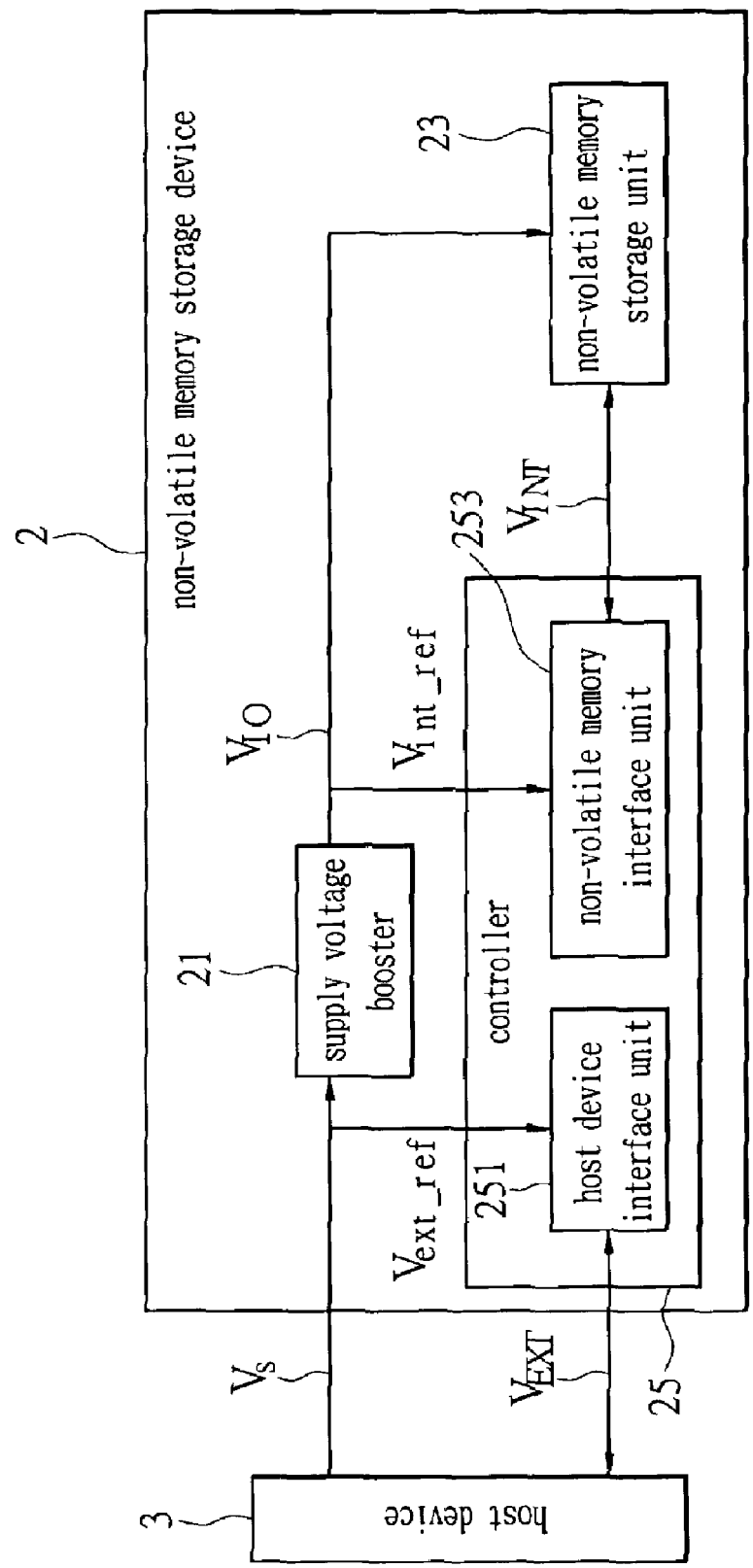
FIG. 2 is a functional block diagram showing a non-volatile memory storage device with boosted supply voltage and signal level.

In the prior art, the host device supplies power to the non-volatile memory storage device, and the supply voltage is lower than the internal operating voltage of the non-volatile memory in the non-volatile memory storage device. However, according to the present invention, as shown in FIG. 2, which shows a functional block diagram of a non-volatile memory storage device with boosted supply voltage and signal level, through the supply voltage booster 21 boosting the level of the external supply voltage $V_S$ up to the internal operating voltage $V_{IO}$, which conforms to the operation requirement of the non-volatile memory storage unit 23, the non-volatile memory storage unit 23 still can operate normally.

Because the controller 25 has to interface with the host device 3 and the non-volatile memory storage unit 23 simultaneously, the signal reference voltage Vext_ref of the host device interface unit 251 will be the external supply voltage $V_S$ and the signal reference voltage Vint_ref of the non-volatile memory interface unit 253 will be the internal operating voltage $V_{IO}$, so that the internal operating voltage $V_{IO}$ is higher than the external supply voltage $V_S$. Then, for correctly and stably identifying, by the two parties of signal transmission, the high potential signals of the voltage level $V_{EXT}$ of an external signal between the controller 25 and the host device 3 and the voltage level $V_{INT}$ of an internal signal between the controller 25 and the non-volatile memory storage unit 23, these two sets of reference power sources inside the controller 25 have to be separated independently so as to have a dual-interface installation with the host device interface 251 and the non-volatile memory interface unit 253, wherein the host device interface unit 251 produces the external signal according to the external supply voltage $V_S$ and the non-volatile memory interface unit 253 processes the internal signal in accordance with the internal operating voltage $V_{IO}$. Furthermore, because the internal operating voltage $V_{IO}$ is higher than the external supply voltage $V_S$, the voltage level $V_{INT}$ of the internal signal is larger than the voltage level $V_{EXT}$ of the external signal.

In the above-described non-volatile memory storage device 2, a supply voltage booster 21 receives an external supply voltage $V_S$, boosts thereof, and then outputs an internal operating voltage $V_{IO}$. The non-volatile memory storage unit 23 receives the internal operating voltage $V_{IO}$, provides the storage of digital information and includes at least a non-volatile memory. Then, the controller 25 includes a host device interface unit 251 which is electrically connected to the host device 3 for receiving the external voltage $V_S$ and transmitting an external signal, which conforms to the external supply voltage $V_S$, between the host device 3 and thereof, wherein the voltage level $V_{EXT}$ of the external signal is conformed to the external voltage $V_S$. On the other hand, the non-volatile memory interface unit 253 is electrically connected to the non-volatile memory storage unit 23 for receiving the internal voltage $V_{IO}$ and transmitting an internal signal, which conforms to the internal operating voltage $V_{IO}$, between the non-volatile memory storage unit 23 and thereof, wherein the voltage level of the internal signal $V_{INT}$ is conformed to the internal voltage $V_{IO}$. Therefore, the purpose of using a non-volatile memory which adopts an operating voltage higher than the supply voltage as a storage medium is achieved.

Figure 3:
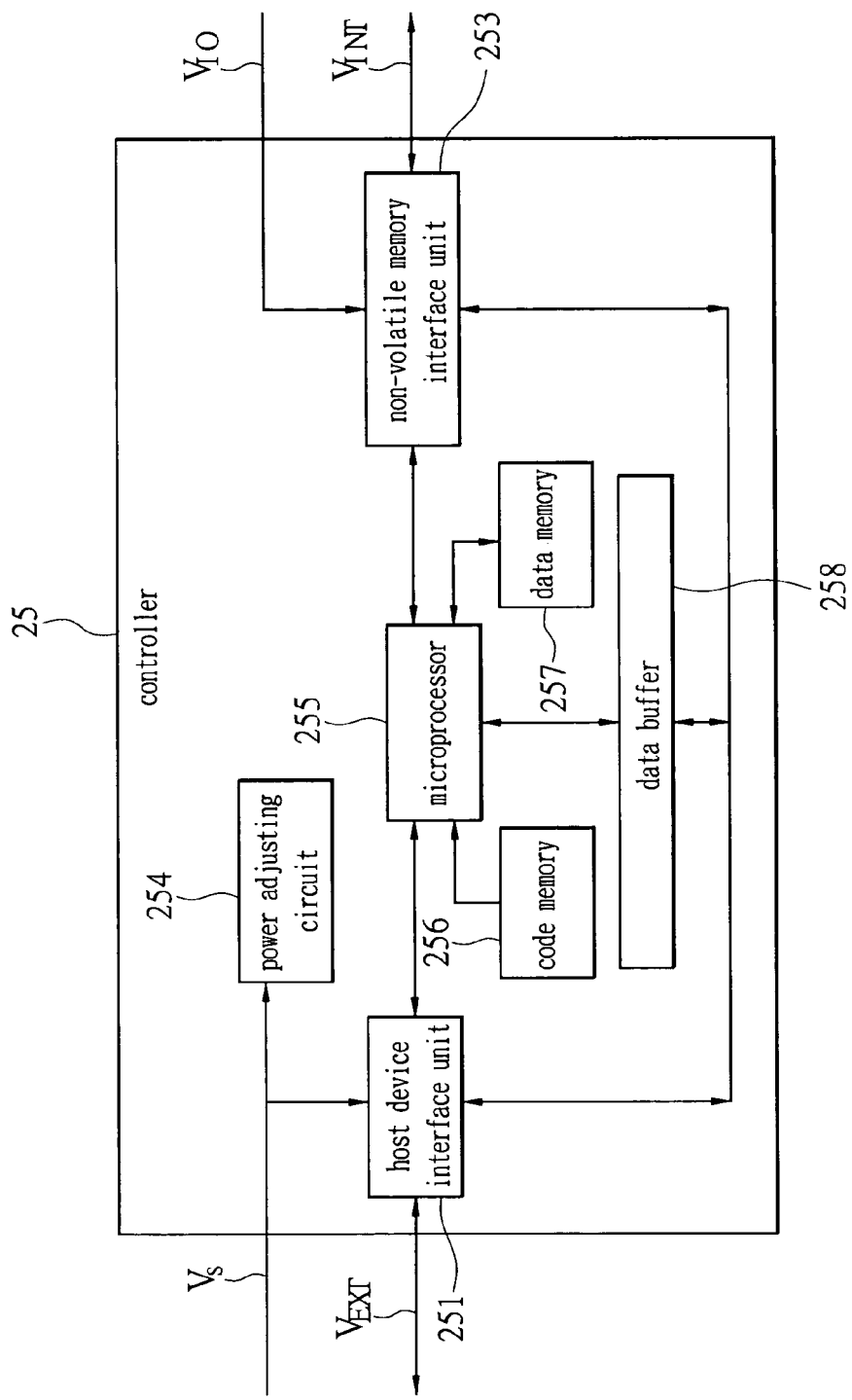
FIG. 3 is a functional block diagram showing a controller for non-volatile memory storage device with dual-interface signal level.

Furthermore, the controller 25 with dual interface signal level will be discussed. Please refer to FIG. 3 which shows a functional block diagram of a controller for a non-volatile memory storage device with dual interface signal level. Following the description above, the controller 25 utilizes a non-volatile memory interface unit 253 to connect to a non-volatile memory storage unit 23, and further, the non-volatile memory interface unit 253 is mainly used to boost a signal level between the controller 25 and the non-volatile memory storage unit 23 up to the internal operating voltage $V_{IO}$ of the non-volatile memory storage unit 23. The host device interface unit 251 is connected to the host device 3 for conforming a signal level between the controller 25 and the host device 3 to the external supply voltage $V_S$ of the non-volatile memory storage device 2. Moreover, in the controller 25, it further includes utilizing an embedded micro-processor 255 to execute a control program; utilizing a code memory 256 to store codes required in executing the control program; utilizing a data memory 257 to temporally store the data related to the control program; and utilizing a data buffer unit 258 to temporally store the data exchanged between the host device 3 and the non-volatile memory storage unit 23 when the host device 3 accesses the non-volatile memory storage device 2. In addition, the power adjusting circuit 254 may receive the external supply voltage $V_S$ for providing the operating voltage required for relative elements.

Furthermore, the non-volatile memory storage device 2 according to the present invention further includes a substrate for mounting the supply voltage booster 21, the controller 25 and the non-volatile memory storage unit 23 thereon so as to achieve mutual transmissions of corresponding signals for each element through an electrical conductivity of the substrate and for mounting an electrical conductive interface thereon so as to connect to the host device 3. Besides, the device 2 further includes a sealing package for packaging elements in the non-volatile memory storage device 2 but leaving the electrical conductive interface exposed for connecting to the host device 3, wherein the substrate can be a printed circuit board.

Figure 4:
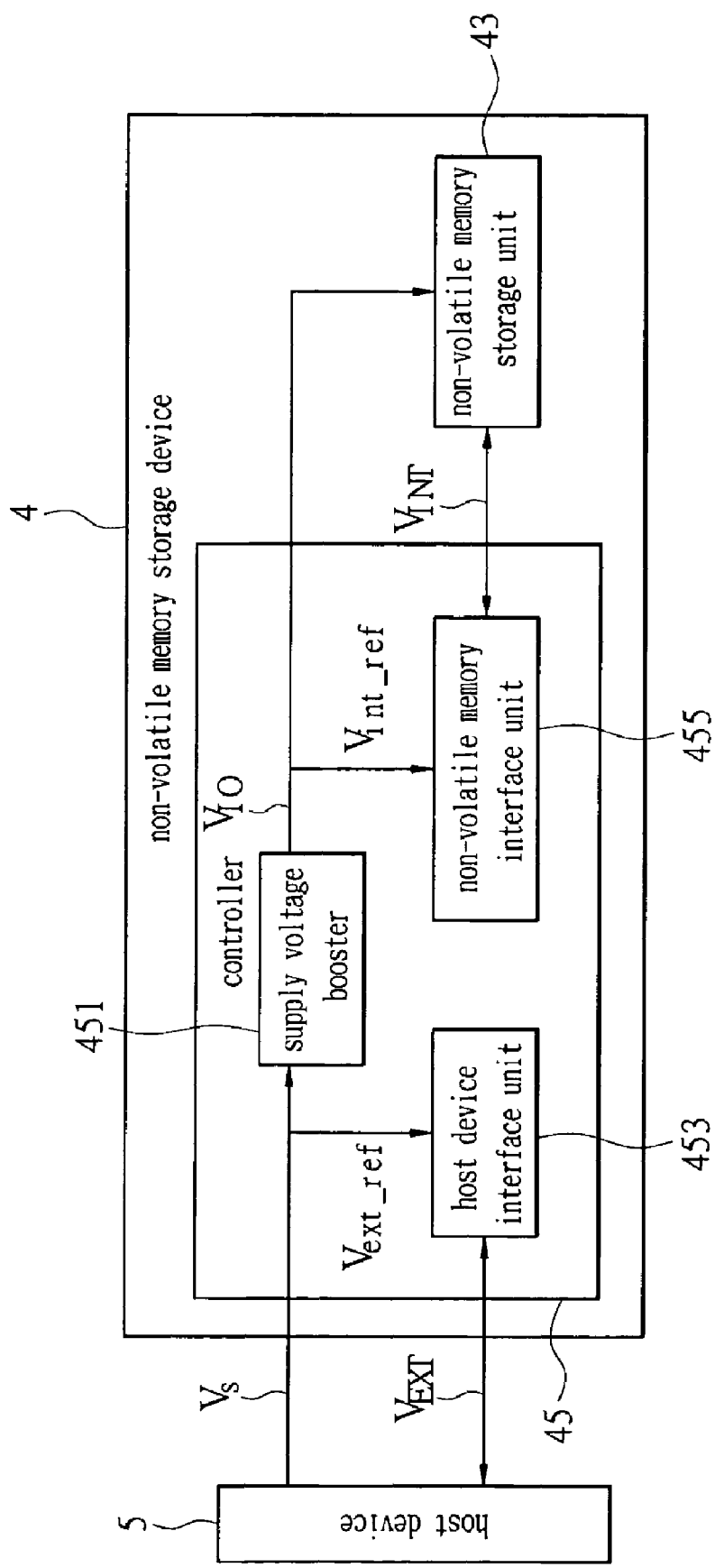
FIG. 4 is a functional block diagram showing a non-volatile memory storage device having boosted supply voltage and signal level and adopting integration controller.

Please refer to FIG. 4 which is a functional block diagram showing a non-volatile memory storage device having boosted supply voltage and signal level and adopting integration controller. The non-volatile memory storage device includes a non-volatile memory storage unit 43 and a controller 45. The non-volatile memory storage unit includes at least a non-volatile memory. The controller 45 includes a supply voltage booster 451 for receiving an external voltage $V_S$ provided by a host device 5, boosting the external voltage $V_S$ and then outputting an internal voltage $V_{IO}$ and for providing the internal voltage $V_{IO}$ to the non-volatile memory storage unit 43. The controller 45 further includes a host device interface unit 453 electrically connected to a host device 5 for receiving the external voltage $V_S$ and transmitting an external signal, whose voltage level $V_{EXT}$ conforms to the external supply voltage $V_S$, between the host device 5 and thereof. In addition, in the controller 45, a non-volatile memory interface unit 455 electrically connected to the supply voltage booster 451 is also utilized in the controller 45 for receiving the internal voltage $V_{IO}$ and transmitting an internal signal, whose voltage level is conformed to the internal voltage $V_{IO}$, between the non-volatile memory storage unit 43 and thereof.

Because the internal operating voltage $V_{IO}$ should be larger than the external supply voltage $V_S$ of the host device 5, the controller 45 has to utilize a dual-reference-potentials installation with the host device interface unit 453 and the non-volatile memory interface unit 455 for simultaneously interfacing with the host device 5 and the non-volatile memory interface unit 455. At this time, the signal reference voltage Vext_ref of the host device interface unit 453 is used as the external supply voltage $V_S$ and the signal reference voltage Vint_ref of the non-volatile memory interface unit 455 is used as the internal operating voltage $V_{IO}$, so that the internal operating voltage $V_{IO}$ is higher than the external supply voltage $V_S$. For correctly and stably identifying, by the two parties of signal transmission, the high potential signals of the voltage level $V_{EXT}$ of an external signal between the controller 45 and the host device 5 and the voltage level $V_{INT}$ of an internal signal between the controller 45 and the non-volatile memory storage unit 43, these two sets of reference power sources inside the controller 45 have to be separated independently so as to have a dual-reference-potentials installation with a host device interface 451 and a non-volatile memory interface unit 453, wherein the host device interface unit 453 may produce the external signal according to the external supply voltage $V_S$ so as to conform the voltage level $V_{EXT}$ of the external signal to the external supply voltage $V_S$, and the non-volatile memory interface unit 455 may process the internal signal in accordance with the internal operating voltage $V_{IO}$. Furthermore, because the internal operating voltage $V_{IO}$ is higher than the external supply voltage $V_S$, the voltage level $V_{INT}$ of the internal signal is larger than the voltage level $V_{EXT}$ of the external signal.

Figure 5:
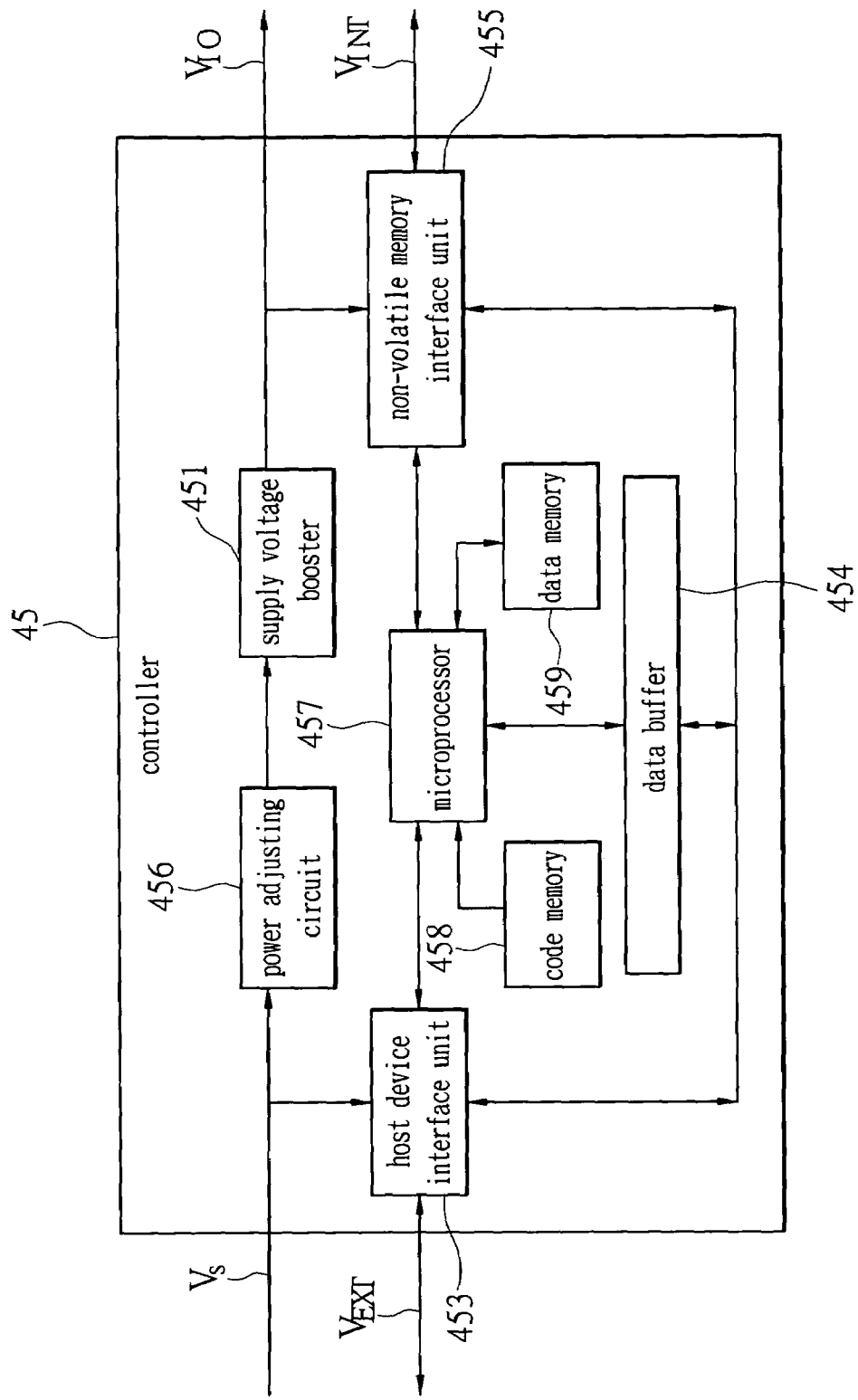
FIG. 5 is a functional block diagram showing a controller for a non-volatile memory storage device with boosted supply voltage and signal level.

Continuously, the controller 45 for integrating boosted supply voltage and signal level is further discussed as shown in FIG. 5 which shows a functional block diagram of a controller for a non-volatile memory storage device with boosted supply voltage and signal level. Following the description above, in the controller 45, the non-volatile memory interface unit 455 is connected to a non-volatile memory storage unit 43 for boosting a signal level between the controller 45 and the non-volatile memory storage unit 43 to an operating voltage $V_{IO}$ of the non-volatile memory storage unit 43, and the host device interface unit 453 is connected to the host device 5 for conforming a signal level between the controller 45 and the host device 5 to the supply voltage $V_S$ of the non-volatile memory storage device 4, wherein the power adjusting circuit 456 is used to receive the supply voltage $V_S$ and transmit the processed supply voltage $V_S$ to the supply voltage booster 451, and then the supply voltage booster 451 may boost thereof up to an internal operating voltage $V_{IO}$. In addition, the controller 45 further includes an embedded micro-processor 457 for executing a control program; a code memory 458 for storing codes required in executing the control program; a data memory 459 for temporally storing data related to the control program; and a data buffer unit 454 for temporally storing the data exchanged between the host device 5 and the non-volatile memory storage unit 43 when the host device 5 accesses the non-volatile memory storage device 4.

Furthermore, the non-volatile memory storage device 4 according to the present invention further includes a substrate for mounting the controller 45 and the non-volatile memory storage unit 43 thereon so as to achieve mutual transmissions of corresponding signals for each element through an electrical conductivity of the substrate and for mounting an electrical conductive interface thereon so as to connect to the host device 5. Besides, the device 4 further includes a sealing package for packaging elements in the non-volatile memory storage device 4 but leaving the electrical conductive interface exposed for connecting to the host device 5, wherein the substrate can be a printed circuit board.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A non-volatile memory storage device, comprising:
   a supply voltage booster for receiving an external voltage, boosting that voltage and then outputting an internal voltage at a voltage level greater than the external voltage;
   a non-volatile memory storage unit coupled to the supply voltage booster for receiving the internal voltage; and
   a controller coupled to the non-volatile memory storage unit and being coupled to the supply voltage booster for receiving the internal voltage, the controller including:
      a non-volatile memory interface unit for transferring digital information signals between the non-volatile memory storage unit and the controller at a voltage level boosted to conform to the internal voltage, the non-volatile memory interface unit being electrically connected to the non-volatile memory storage unit and receiving the internal voltage; and
      a host device interface unit for transferring digital information signals between a host device and the non-volatile memory interface unit at a voltage level conforming to the external voltage, the host device interface unit being coupled to the host device and the non-volatile memory interface unit and receiving the external voltage.

2. The device as claimed in claim 1, wherein the non-volatile memory storage unit comprises at least a non-volatile memory.

3. The device as claimed in claim 2, wherein the controller further comprises:
- an embedded micro-processor for executing a control program;
- a code memory for storing codes required in executing the control program;
- a data memory for temporally storing the data required in executing the control program; and
- a data buffer unit for temporally storing the data exchanged between the host device and the non-volatile memory storage unit when the host device accesses the non-volatile memory storage device.

4. The device as claimed in claim 1, wherein the internal voltage is an operating voltage of the non-volatile memory storage unit.

5. A controller for a non-volatile memory storage device with dual interface signal level shifting, comprising:
- a non-volatile memory interface unit connected to a non-volatile memory storage unit for boosting a signal level of digital information signals communicated therebetween to conform to an operating voltage of the non-volatile memory storage unit; and
- a host device interface unit coupled to a host device and the non-volatile memory interface unit for communicating the digital information signals to the host device retrieved from the non-volatile memory storage unit through the non-volatile memory interface unit at a signal level reduced to conform to an operating voltage of the host device, the signal level of the non-volatile memory storage unit being greater than the signal level of the host device.

6. The controller as claimed in claim 5, wherein the controller further comprises:
- an embedded micro-processor for executing a control program;
- a code memory for storing codes required in executing the control program;
- a data memory for temporally storing the data required in executing the control program; and
- a data buffer unit for temporally storing the data exchanged between the host device and the non-volatile memory storage unit when the host device accesses the non-volatile memory storage device.

7. A non-volatile memory storage device, comprising:
a non-volatile memory storage unit; and
a controller coupled to the non-volatile memory storage unit, the controller including:
a supply voltage booster for receiving an external voltage, boosting that voltage and then outputting an internal voltage at a voltage level greater than the external voltage, the supply voltage booster being coupled to the non-volatile memory storage unit for providing the internal voltage to the non-volatile memory storage unit;
a non-volatile memory interface unit electrically connected to the non-volatile memory storage unit for communicating digital information signals therebetween, the non-volatile memory interface unit receiving the internal voltage and boosting a voltage level of the digital information signals to conform to the internal voltage; and
a host device interface unit coupled to a host device and the non-volatile memory interface unit, the host device interface unit receiving the external voltage and transferring the digital information signals between the host device and a port thereof at a voltage level conforming to the external voltage.

8. The device as claimed in claim 7, wherein the internal voltage is an operating voltage of the non-volatile memory storage unit.

9. The device as claimed in claim 7, wherein the non-volatile memory storage unit comprises at least a non-volatile memory.

10. The device as claimed in claim 9, wherein the controller further comprises:
- an embedded micro-processor for executing a control program;
- a code memory for storing codes required in executing the control program;
- a data memory for temporally storing the data required in executing the control program; and
- a data buffer unit for temporally storing the data exchanged between the host device and the non-volatile memory storage unit when the host device accesses the non-volatile memory storage device.

11. The device as claimed in claim 9, wherein the internal voltage is an operating voltage of the non-volatile memory storage unit.

12. The device as claimed in claim 9, wherein the external voltage is a supply voltage of the non-volatile memory storage device.

13. A controller for a non-volatile memory storage device with boosted voltage and signal level shifting, comprising:
- a non-volatile memory interface unit connected to a non-volatile memory storage unit for boosting a signal level of digital information signals communicated therebetween to conform to an operating voltage of the non-volatile memory storage unit;
- a supply voltage booster coupled to the non-volatile memory interface unit and the non-volatile memory storage unit for boosting an externally supplied voltage up to the operating voltage of the non-volatile memory storage unit to supply the boosted voltage to the non-volatile memory interface unit and the non-volatile memory storage unit; and
- a host device interface unit connected to a host device and the non-volatile memory interface unit, the host device interface unit receiving the externally applied voltage and transferring the digital information signals between the host device and the non-volatile memory storage unit through the non-volatile memory interface unit at a signal level reduced to conform to an operating voltage of the host device, the operating voltage of the host device being the externally applied voltage.

14. The device as claimed in claim 13, wherein the controller further comprises:
- an embedded micro-processor for executing a control program;
- a code memory for storing codes required in executing the control program;
- a data memory for temporally storing the data required in executing the control program; and
- a data buffer unit for temporally storing the data exchanged between the host device and the non-volatile memory storage unit when the host device accesses the non-volatile memory storage device.

* * * * *